United States Patent
Bleiweiss et al.

[11] Patent Number: 6,144,714
[45] Date of Patent: Nov. 7, 2000

[54] PROGRAMMABLE FRACTIONAL FREQUENCY DIGITAL FREQUENCY SYNTHESIZER FOR SYNCHRONOUS RESIDUAL TIME STAMP SERVICE CLOCK REGENERATOR PHASE LOCKED LOOP

[75] Inventors: Scott Bleiweiss, Upton; Peter Chantiles, Sudbury, both of Mass.

[73] Assignee: Maker Communications, Inc., Framingham, Mass.

[21] Appl. No.: 09/003,293

[22] Filed: Jan. 6, 1998

[51] Int. Cl.[7] .............................. H03D 3/24; H03K 21/00; G06F 1/02
[52] U.S. Cl. ............................... 375/376; 377/48; 377/49; 364/718.02
[58] Field of Search .................................... 375/376, 371, 375/372, 373, 377, 354; 370/516, 395, 905, 389, 401, 503, 509, 399, 506, 505; 377/48, 49, 56, 114; 455/260, 165.1, 183.1, 183.2; 364/718.02; 331/46, 47, 48, 60, 61, 34, 38, 41; 329/325, 307, 360; 332/127

[56] References Cited

U.S. PATENT DOCUMENTS

| | | | |
|---|---|---|---|
| 4,658,406 | 4/1987 | Pappas | 377/48 |
| 5,260,978 | 11/1993 | Fleischer et al. | 375/354 |
| 5,287,182 | 2/1994 | Haskell et al. | 348/500 |
| 5,526,362 | 6/1996 | Thompson | 375/376 |
| 5,555,261 | 9/1996 | Nakayama et al. | 375/356 |
| 5,781,459 | 7/1998 | Bienz | 364/718.02 |

*Primary Examiner*—Stephen Chin
*Assistant Examiner*—Albert Park
*Attorney, Agent, or Firm*—Proskauer Rose LLP

[57] ABSTRACT

A service clock regenerator regenerates a local clock from time stamps of a remote clock transmitted over a network by determining the slope of (or difference between current and previous) time stamps of the remote clock and the slope of time stamps of the local clock. A phase difference is formed as the difference between the slope of the time stamps of the remote clock and the slope of the time stamps of the local clock and this phase difference is accumulated to generate a phase error signal. The phase error signal is filtered to generate a frequency adjustment signal having a magnitude that depends on the phase error signal. The frequency of the local clock is adjusted according to the magnitude of the frequency adjustment signal thereby reducing a phase difference between the remote time stamps and the local time stamps. The (local service) clock signal has a nominal frequency of Fc/(N+K/L) Hz over each successive interval of L periods, where N, K and L are integers, and L>K (where K can be the above noted frequency adjustment signal). Each set of L periods includes a first set of K periods and a second set of L–K periods. These two sets of periods are organized by interleaving two or more non-null subsequences of periods of the first set with two or more non-null subsequences of periods of the second set. During each period of one of the subsequences of the first set, the clock is outputted with a frequency of Fc/N Hz. Likewise, during each period of one of the subsequences of the second set, the clock is outputted with a frequency of Fc/(N+1) Hz. A service clock regeneration system with multiple service clock regenerator modules is also provided. A combined service clock regenerator/synchronous residual time stamp generator is furthermore provided.

4 Claims, 5 Drawing Sheets

PROGRAMMABLE FRACTIONAL FREQUENCY DIGITAL FREQUENCY SYNTHESIZER FOR SYNCHRONOUS RESIDUAL TIME STAMP SERVICE CLOCK REGENERATOR PHASE LOCKED LOOP

RELATED APPLICATIONS

This application is related to the following patent applications:

(1) U.S. patent application Ser. No. 09/003,298, entitled "Synchronous Residual Time Stamp Service Clock Regenerator Phase Locked Loop Phase Comparator and Loop Filter," filed on even date herewith for Scott Bleiweiss and Peter Chantiles;

(2) U.S. patent application Ser. No. 09/003,296, entitled "Modular Circuitry Architecture for Residual Time Stamp Service Clock Regenerator Phase Locked Loop," filed on even date herewith for Scott Bleiweiss and Peter Chantiles; and (3) U.S. patent application Ser. No. 09/003,297, entitled "Combined Synchronous Residual Time Stamp Generator and Service Clock Regenerator Architecture," filed on even date herewith for Scott Bleiweiss and Peter Chantiles.

The above-listed patent applications are assigned to the same assignee as this application and are incorporated herein by reference.

FIELD OF THE INVENTION

This application pertains to communication networks, such as asynchronous transfer mode (ATM) networks. More particularly, the invention pertains to providing a mechanism for regenerating a service clock associated with information transmitted via a communication network.

BACKGROUND OF THE INVENTION

An asynchronous transfer mode (ATM) network is a communication network which can transfer information from one or more sources to one or more destinations. The communication network itself may be composed of multiple communicating nodes (e.g., terminals, routers, servers, switches, etc.) that are interconnected to each other by physical communication links (wires, cables, optical fibers, RF channels, etc.). A node transmits a signal containing a bitstream to an adjacent node via the communication link that connects the two adjacent nodes. The transmitted bitstream is organized into fixed sized packet or "cell" slots for carrying 53 byte packets called cells. Each cell has a 5 byte header, for communicating control information, and a 48 byte payload for communicating a message to be conveyed between nodes. A node allocates a "virtual channel" to each communication, which amongst other things, identifies an adjacent node to which cells of the communication must be transmitted. A sequence of virtual channels of nodes on a path between a source node and a destination node identifies a virtual channel connection. The source node transmits cells to the destination node via this sequence of virtual channels, i.e., from node to node on the path, in a bucket brigade like fashion. Prior to transmitting the information, the source node segments the information into 48 byte sized messages and appends a 5 byte header to each such message to form a cell. The source node writes a virtual address into the cell header, such as a virtual channel identifier, which enables each node on the path that receives the cell to determine the outgoing virtual channel on which to transmit the cell. A destination node receiving the cells extracts the messages from the payloads and reassembles the messages (in the appropriate order) into the originally transmitted information.

Consider that cells are received at each node from a variety of communication links. It is possible that multiple cells are contemporaneously received that must be outputted on the same communication link. Because only one cell can be outputted at a time on the same communication link, the contemporaneously received cells must be transmitted sequentially. Thus, cells may be temporarily buffered pending transmission. Such buffering introduces a latency in the delivery of the cell. In the alternative, a transmitted cell may be discarded because it is received at a congested node (a node receiving far more cells than can be transmitted) or received with uncorrectable errors at the node. When a cell is discarded, it is often retransmitted from the source at a later time. The latency incurred by cells of a specific communication varies from moment to moment in the communication network. As a result, jitter is introduced into the delivery of information from the source node to the destination node.

It is desirable to support delivery of constant bit rate (CBR) services, such as audio and voice communication using an ATM network. However, CBR communications must be delivered in a synchronous, de-jittered fashion. Otherwise, the CBR communication will contain discontinuities or gaps which degrade the communication or render the communication completely unintelligible.

If the service clock signal is known, the destination node can attempt to regenerate the same service clock for resynchronizing the received CBR information. The problem is that the locally generated clock at the destination node is subject to drift and will not track the remote service clock at the source node with sufficient accuracy to enable proper resynchronization of the received CBR information.

FIG. 1 illustrates a system for overcoming these problems associated with communicating a CBR service via an ATM network disclosed in U.S. Pat. No. 5,260,978. In FIG. 1, CBR data produced in synchronism with an original service clock is segmented into packets by SAR (segmentation and reassembly) and SRTS generator circuit 14 of a source node 12. In addition, the original service clock, and a network clock, are used to generate time stamps, referred to as synchronous residual time stamps (SRTS samples), in segmentation and reassembly (SAR) and SRTS generator circuit 14 as described below. The network clock can be any clock signal available throughout the network, such as the OC3/DS3 155 Mbit/sec data link bit clock used for synchronizing the transmission of the bitstream of various links of the ATM network 16. The SRTS samples are inserted into the headers of the cells carrying the CBR data and transmitted via the ATM network 16 to the destination node 18. At the node 18, an SAR and service clock regenerator circuit 20 reassembles the CBR data stream. The SAR and service clock recovery circuit 20 furthermore extracts the SRTS samples. Using the network clock and the SRTS samples, the SAR and service clock recovery circuit 20 regenerates the service clock and resynchronizes the received CBR data.

FIG. 2 illustrates how SRTS samples are generated. The SAR and SRTS generator 14 counts the number of network clock ticks in each successive interval 22, 24 of 3008 service clocks. Representations of these counts form the SRTS samples transmitted in cells. At the SAR and service clock regenerator circuit 20 of destination node 18, a service clock that has exactly the same frequency as the original, remote service clock at the node 12 is generated. The SAR and service clock regenerator circuit 20 counts network clock ticks. A representation of each locally generated count of network clock ticks forms a local SRTS sample. The local SRTS sample is compared to a corresponding representation of an incoming, remote SRTS sample extracted from incoming cells. The locally generated service clock is then adjusted based on a difference between the two SRTS samples.

The locally generated counts will only vary slightly from the counts of the remote service clock. Thus, the representations of the local and remote SRTS samples include only a sequence of the least significant four bits of the counts or SRTS samples.

FIG. 3 shows a prior art service clock regenerator 30. Incoming remote SRTS samples (of the remote service clock of the source node 12) received at the destination node 18 are temporarily stored in FIFO 32. Meanwhile, a network clock, having a frequency of $F_{NET}$ is fed to a frequency divider 34 which produces a lower frequency network clock having a frequency $F_{NETx}=F_{NET}/x$. The value of x may be chosen in relation to the frequency of the service clock so that the lower frequency network clock is greater in frequency than the service clock but less than twice the frequency of the service clock. The reduced frequency network clock is fed to the increment input of a 4-bit free-running roll-over counter 36. Herein, a "roll-over counter" is a counter that repeatedly counts up to a maximum count, wraps around to zero after reaching the maximum count, and continues to count up to the maximum value.

Each locally generated count of the counter 36 is outputted to a 4-bit comparator 38. The 4-bit comparator 38 also receives a corresponding remote SRTS. When the local count of the counter 36 reaches a value equal to the received remote SRTS with which it is compared, a pulse is outputted. The pulses outputted from the comparator 38 are gated through AND gate 40. That is, the AND gate 40 also receives a clock signal from a gate counter 42 running at the SRTS sampling period rate, e.g., about 513 Hz for a 1.544 MHZ T1 service clock. These gated pulses are then multiplied by 3008 in an analog phase-locked loop (PLL) 44 to regenerate the service clock.

FIG. 4 shows an alternative prior art service clock regenerator 50. Like the service clock regenerator 30 of FIG. 3, incoming SRTS samples of the remote service clock at the source node are temporarily stored in an incoming SRTS sample FIFO 52. Meanwhile, the network clock with frequency $F_{NET}$ is fed to a frequency divider that divides the network clock signal frequency by x to produce a clock with frequency $F_{NETx}$. The reduced frequency network clock signal is fed to a local SRTS generator 56. The local SRTS generator 56 also receives the recovered service clock outputted from a course tuning oscillator 60. The local SRTS generator 56 counts the number of ticks of the reduced frequency network clock modulo 16 that occur every SRTS interval (of 3008 ticks of the recovered service clock). This produces a local 4-bit SRTS sample of the locally regenerated service clock. The local SRTS sample is then compared with (i.e., subtracted from) a corresponding incoming remote SRTS sample of the remote clock in a phase comparator 58. This difference, which represents the phase difference between the local service clock and the remote service clock, is then fed to the coarse tuning oscillator 60 to adjust the frequency of the local service clock. That is, when the locally regenerated service clock leads the remote service clock (locally generated SRTS sample is greater than incoming SRTS sample), the frequency of the coarse tuning oscillator 60 is reduced. Likewise, when the locally regenerated service clock lags the remote service clock (locally generated SRTS sample is less than the incoming SRTS sample), the frequency of the coarse tuning oscillator 60 is increased.

One problem associated with the two system clock regenerators 30 and 50 is that they both use a simple difference between a parameter of the local service clock and a parameter of the remote service clock. However, this is not exactly equivalent to the phase difference between the local service clock and the remote service clock. Rather, it is merely an indication of the difference in count between the two. In other words, if the local service clock had the identical frequency as the remote service clock but the local count was different than the received SRTS, the service clock regenerators 30 and 50 would nevertheless attempt to adjust the frequency of the local service clock. In addition, in the service clock regenerators 30 and 50, the two values subtracted in the comparators 38, 58 are both generated by 4-bit roll-over counters. If one counter counts faster than the other, it is possible for the faster counter to roll-over before the other counter. If a difference is formed between the counts of these two counters at that moment, then the slower counter will have a higher count than the faster counter. Thus, the difference will have the wrong polarity thereby causing an opposite frequency adjustment as should be applied (i.e., the frequency of the local service clock will be increased when it should be decreased or vice versa). Both of these limitations tend to increase the PLL acquisition time and to destabilize the PLL tracking.

A second problem with the service clock regenerators 30 and 50 is that no filtering is applied to the adjustment signal produced by the comparison circuit 38 or 58. This is undesirable because it tends to adjust the frequency of the service clock too rapidly.

It is an object of the present invention to overcome the disadvantages of the prior art.

The service clock regenerator 30 uses an analog PLL. Such a PLL is difficult to incorporate into a digital integrated circuit. On the other hand, the PLL used in service clock regeneration includes an oscillator which must oscillate at a selectable frequency F/X, where F is a constant, but X is a selectable real number. This can be achieved in the prior art by oscillating the frequency synthesizer at a frequency F/N for a selectable number of K periods. The frequency synthesizer then oscillates at a frequency of F/(N+1) for L–K periods. This is repeated during successive L period intervals to achieve a frequency between F/N and F/(N+1). Although over L periods, the frequency synthesizer nominally produces a signal having the correct frequency, the frequency synthesizer oscillates too slowly during too many (K) consecutive periods and then oscillates too quickly during too many subsequent (L–K) consecutive periods. It is an object of the present invention to improve on this technique.

It is also an object of the present invention to provide an architecture that is modular and easily scalable, e.g., on an integrated circuit.

It is a further object of the present invention to provide a flexible service clock architecture that can selectively recover a service clock from remotely originating SRTS samples or generate SRTS samples for enabling regeneration of a local service clock at a remote node.

SUMMARY OF THE INVENTION

These and other objects are achieved by the present invention. According to one embodiment, a PLL regenerates a local clock from time stamps of a remote clock transmitted over a network as follows. The slope of (or difference between current and previous) time stamps of the remote clock and the slope of time stamps of the local clock are determined. A phase difference is formed as the difference between the slope of the time stamps of the remote clock and the slope of the time stamps of the local clock and this phase difference is accumulated to generate a phase error signal. The phase error signal is filtered to generate a frequency adjustment signal having a magnitude that depends on the phase error signal. The frequency of the local clock is adjusted according to the magnitude of the frequency adjustment signal thereby reducing a phase difference between the remote clock and the local clock.

The local and remote clocks illustratively are service clocks and the time stamps illustratively are SRTS samples. It is the "slope," or derivative of the locally generated SRTS samples and the slope of the remotely received SRTS samples that contains the frequency information, and not the individual SRTS samples themselves. By using the slopes of the SRTS samples, the local clock acquisition occurs more quickly according to the invention and is more stable.

According to another embodiment, the adjustment of the frequency of the local service clock is achieved as follows. The clock signal has a nominal frequency of Fc/(N+K/L) Hz over each successive interval of L periods, where N, K and L are integers, and L>K. For example, K can be the above noted frequency adjustment signal. Each set of L periods includes a first set of K periods and a second set of L−K periods. These two sets of periods are organized by interleaving two or more non-null subsequences of periods of the first set with two or more non-null subsequences of periods of the second set. During each period of one of the subsequences of the first set, the clock is generated with a frequency of Fc/(N+1) Hz. Likewise, during each period of one of the subsequences of the second set, the clock is generated with a frequency of Fc/N Hz.

By interleaving multiple subsets of the K periods during which the clock has a high frequency with multiple subsets of L−K periods during which the clock as a low frequency, the different clock frequencies of the clock are more evenly distributed over each group of L periods. In other words, for at least one value of K, the clock has a frequency of Fc/(N+1) for less than K consecutive periods, and has a frequency of Fc/N for less than L−K consecutive periods.

According to another embodiment, a service clock regenerator system in a node of a communication system includes a system clock generator, a plurality of service clock regenerator modules and a processor executing instructions for implementing a plurality of phase comparators and loop filters. The system clock generator is for generating a system clock. Each of the service clock regenerator modules includes a digital frequency synthesizer and a synchronous residual time stamp (SRTS) generator. The digital frequency synthesizer receives the system clock, and an indication of a fractional frequency of the system clock and generates a service clock having the indicated fractional frequency of the system clock. The SRTS generator receives a network clock common to each node on the network. The SRTS generator counts pulses of the network clock and outputs a current count of the pulses each time a certain number of pulses of the service clock are generated. One phase comparator and loop filter is provided for, and corresponds to, each service clock regenerator module. Each phase comparator and loop filter receives each remotely originating service clock time stamp from the network that corresponds to a remote service clock regenerated by the service clock regenerator module to which the respective phase comparator and loop filter corresponds. The phase comparator and loop filter also receives each count outputted by the SRTS generator of its corresponding service clock regenerator module. Each phase comparator and loop filter outputs an indication to the digital frequency synthesizer of its corresponding service clock regenerator module. The outputted indication is for adjusting a frequency of the service clock according to a phase difference between a remotely originating service clock time stamp and a count contemporaneously outputted from the SRTS generator.

According to yet another embodiment, a combined service clock regenerator/residual time stamp generator is provided. The combined service clock regenerator/residual time stamp generator has a system clock generator, a digital frequency synthesizer, an SRTS generator, a cell segmenter and a phase comparator and loop filter. The system clock generator generates a system clock. The digital frequency synthesizer receives the system clock and an indication of a fractional frequency of the system clock. The digital frequency synthesizer generates a service clock having the indicated fractional frequency of the system clock. The SRTS generator receives a network clock common to each node on the network. The SRTS generator counts pulses of the network clock and outputs a current count of the rollover counter each time a certain number of pulses of the service clock are generated by the digital frequency synthesizer. The phase comparator and loop filter are selectively inserted between an output of the SRTS generator and the indication input to the digital frequency synthesizer during a service clock regenerator mode. The phase comparator and loop filter receive service clock residual time stamps from the network corresponding to a service clock regenerated by the digital frequency synthesizer and output an indication of a frequency that depends on a phase difference between the remote service clock residual time stamps and the current counts outputted from the SRTS generator. The cell segmenter is selectively connected to an output of the SRTS generator during a service clock residual time stamp generation mode. The cell segmenter inserts the current counts outputted from the SRTS generator into service clock residual time stamp slots of a bitstream transmitted from the node to the network.

DETAILED DESCRIPTION OF THE INVENTION

The invention is described below using SRTS samples to recover a service clock in an ATM network as an illustration.

However, the scope of the invention should not be limited to the particular clock synchronization technique or network for which the invention is described. Rather, the invention is applicable to other clocks recovered at a destination node in a variety of jitter inducing networks.

Figure 5:
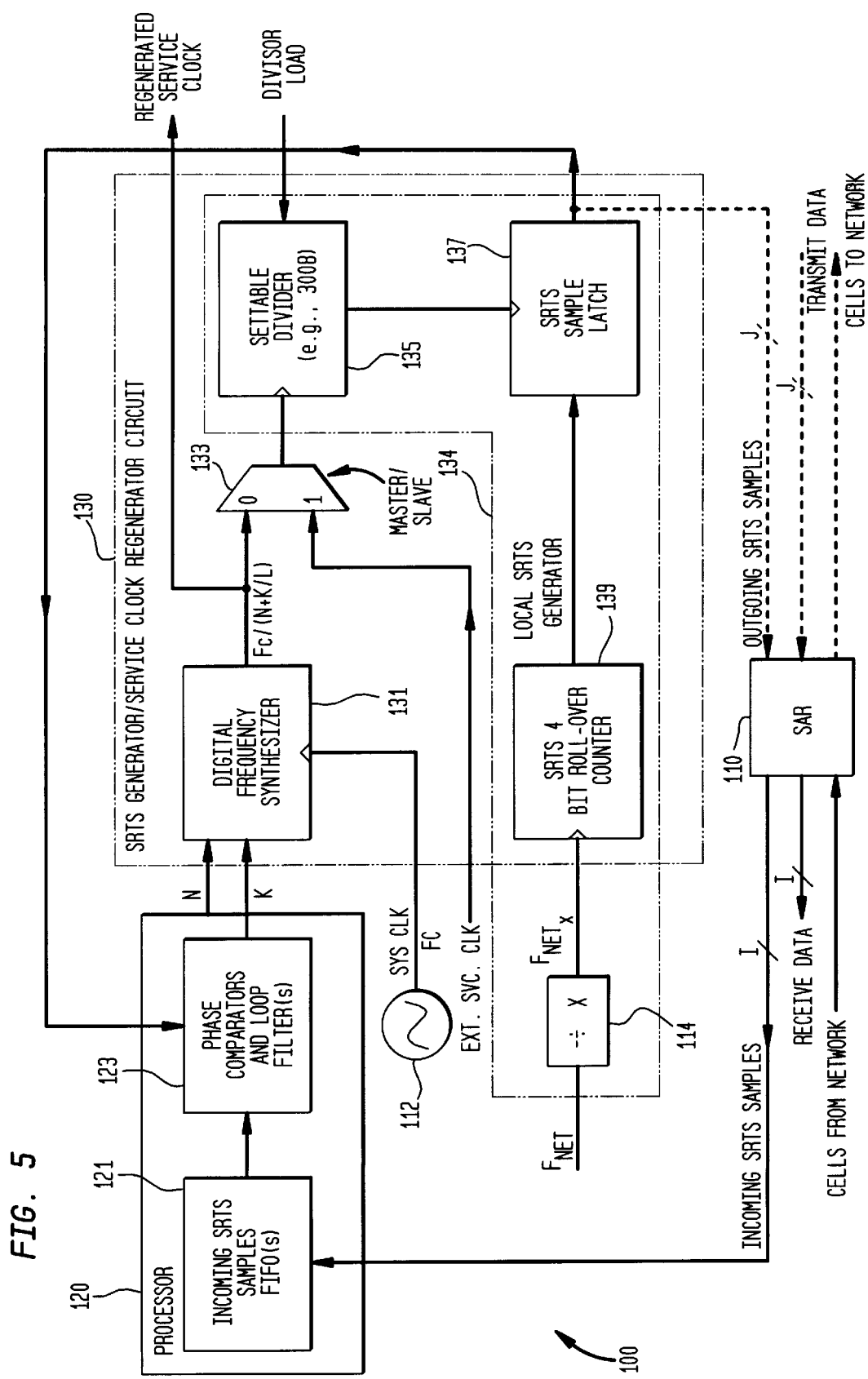
FIG. 5 shows a service clock regenerator/SRTS generator according to an embodiment of the present invention.

Referring to FIG. 5, a circuit 100 is shown which can both generate cells for transmitting data and SRTS samples and can recover a service clock, and receive data, from cells and SRTS samples. An SAR 110 is provided which can receive cells from a network and reassemble one or more data streams therefrom or can segment one or more data streams into cells for transmission to a network. Received cells associated with each separate communication (e.g., virtual channel) are identified. Data is extracted from the payload of cells associated with each communication, and such data is reassembled into the respective communicated data streams. Illustratively, the SAR 110 can reassemble data for up to $I \geq 1$ data streams contemporaneously. SRTS samples (if present) are recovered from the cell headers of each of the I data streams. Such SRTS samples are used, as described below for recovering up to I service clocks associated with each of the I received data streams.

Likewise, the SAR 110 can transmit data for $J \geq 1$ data streams. The data for these J data streams are segmented into cell payloads and an appropriate header is appended to such payloads to form cells. SRTS samples of service clocks associated with up to J data streams are provided and inserted into the cell headers of cells carrying data for the respective data stream. The generation of these SRTS samples is described in greater detail below. These cells are then transmitted to the network.

The circuit 100 also includes a system clock generator 112, an external network clock divider 114, a processor 120 and a combined SRTS generator/service clock regenerator circuit 130. The processor 120 is shown as implementing a received SRTS sample FIFO 121 and a phase comparator and loop filter 123. Of course, use of a processor 120 to implement these individual elements is merely for sake of convenience; these circuits can be implemented using other kinds of circuits such as finite state automata, amplifiers and mixers, etc.

The SRTS generator/service clock regenerator 130 is shown as including a digital frequency synthesizer 131, a multiplexer 133 and a local SRTS generator 134. Preferably, the SRTS generator/service clock regenerator 130 comprises multiple copies (i.e., modules) of the circuits 131, 133, 135, 137 and 139 so that the SRTS generator/service clock regenerator 130 can accommodate simultaneously multiple received data streams multiple transmitted data streams or some combination of the two. In such a case, the processor 120, system clock generator 112 and frequency divider 114 illustratively are connected to corresponding inputs of each copy of the circuits 131, 133, 135, 137 and 139 in parallel. Although only a single processor 120 is connected to each copy of the circuits 131, 133, 135, 137 and 139, the processor 120 implements a separate phase comparator and loop filter 123 for each copy of the circuits 131, 133, 135, 137 and 139, e.g., through time sharing of the processor 120 for each copy of the circuits 131, 133, 135, 137 and 139. Such an architecture conserves circuitry while supporting multiple data streams.

The regeneration of a service clock for a received data stream is now discussed in greater detail. As may be appreciated, the incoming SRTS sample FIFO 121, phase comparator and loop filter 123, digital frequency synthesizer 131, local SRTS generator 134 and local oscillator 112 form a digital PLL. The digital frequency synthesizer 131 receives values N and K and the system clock of frequency Fc. The system clock frequency Fc illustratively is fixed. The value N is predetermined and set depending on the frequency of the system clock Fc and the frequency of the service clock to be regenerated (or generated as described below). The value K may initially be set to one value and may be varied over the course of operation as described below. The digital frequency synthesizer 131 generates a signal having frequency Fc/(N+K/L), where L illustratively is a fixed internal parameter. This signal is the regenerated service clock. The regenerated service clock is received at the multiplexer 133. The multiplexer 133 also receives an external clock (which may be used in generating SRTS samples for transmitted data, as described in greater detail below). A select signal selects the service clock generated by the digital frequency synthesizer 131, when set to 0 (SRTS generator/service clock regenerator slave mode), and selects the externally originating service clock, when set to 1 (SRTS generator/service clock regenerator master mode). Preferably, the multiplexer 133 selects the service clock regenerated by the digital frequency synthesizer 131 when used to regenerate a service clock for a received data stream.

As shown, the local SRTS sample generator 134 includes a 4-bit roll-over counter 139, a set-able frequency divider 135 and an SRTS sample latch 137. The service clock signal selected by the multiplexer 133 is outputted to the set-able frequency divider 135. The frequency divider 135 can be preset to divide the service clock by any value. The frequency divider is illustratively set to 3008 in an ATM application, but may be set to a different value in a different application. The divided frequency service clock, or SRTS sample clock is outputted to the local SRTS sample latch 137.

Meanwhile, the network clock having a frequency $F_{NET}$ is fed to frequency divider 114 which divides the frequency of the network clock by some value x to produce a reduced frequency network clock of frequency $F_{NETx}=F_{NET}/x$. The frequency divider 114 may have a programmable value x or may be substitutable as necessary depending on the frequency $F_{NET}$ and the frequency of the service clock to be recovered (or generated).

The reduced frequency network clock is inputted to an increment or clock input of the 4-bit roll-over counter 139. The 4-bit roll-over counter 139 therefore counts the reduced frequency network clock modulo 16. The count of the 4-bit roll-over counter 139 is outputted to a data input of the local SRTS sample latch 137. The local SRTS sample latch 137 therefore stores the count of the 4-bit roll-over counter 139 in response to each tick of the SRTS sample clock outputted from the frequency divider 135.

When the SAR 110 receives SRTS samples for the received data stream, the SAR 110 outputs these samples to the processor 120. In response, the processor 120 temporarily stores such remote SRTS samples in the incoming SRTS sample FIFO 121. When a new locally generated SRTS sample is available in the local SRTS sample latch 137, an indication is provided to the processor 120. (Actually, the processor 120 polls the SRTS generator/local service clock regenerator 130 periodically to determine when the local SRTS sample latch 137 of each module, including circuits 131, 133, 135, 137, 139, is available.) The phase comparator and loop filter 123 then reads the local SRTS sample from the local SRTS sample latch 137 and one or more corresponding remote SRTS samples from the FIFO 121. The phase comparator and loop filter 123 compares the phases of the remote SRTS sample (of the remote service clock) and the local SRTS sample (of the local service clock) and generates a value K for adjusting the frequency of the regenerated service clock. This value K is outputted to the digital frequency synthesizer 131 which adjusts the frequency of the regenerated service clock.

Figure 1:
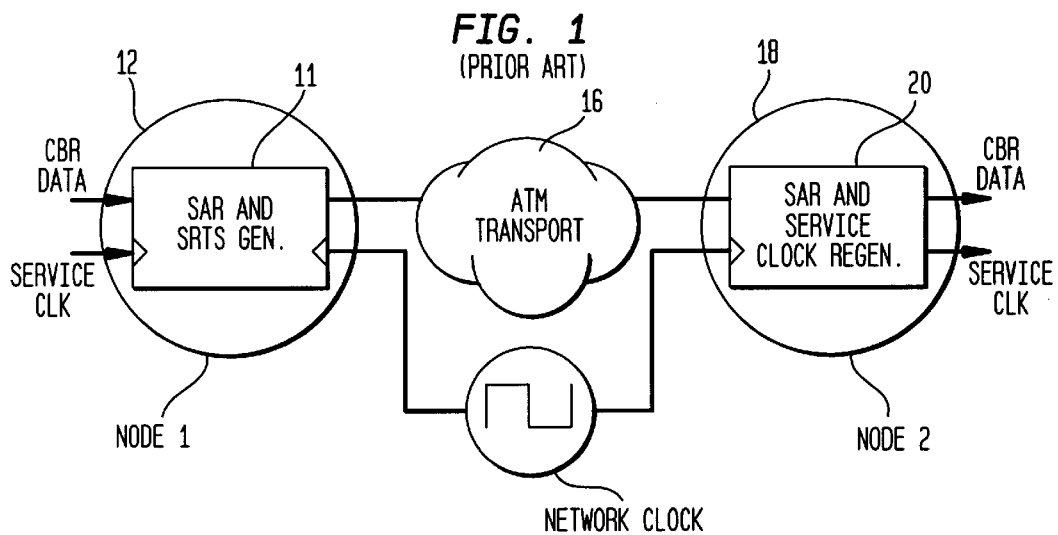
FIG. 1 shows a conventional network supporting service clock regeneration using SRTS samples.
Figure 2:
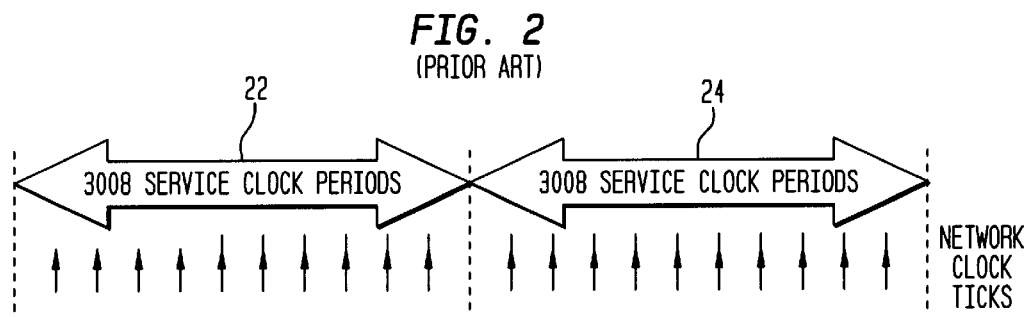
FIG. 2 shows how SRTS samples are generated.
Figure 3:
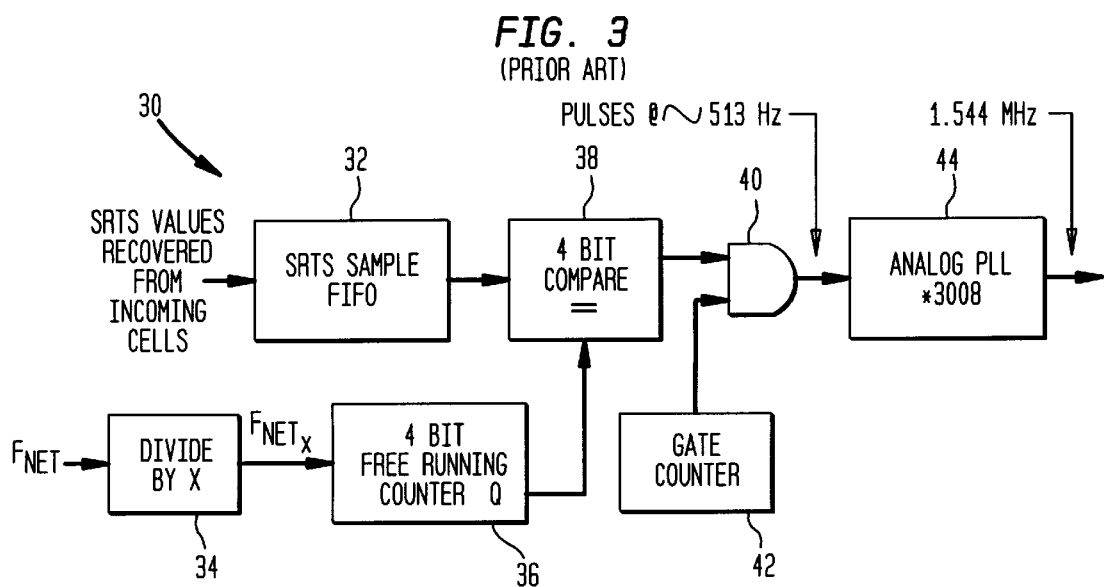
FIG. 3 shows a first conventional service clock regenerator.
Figure 4:
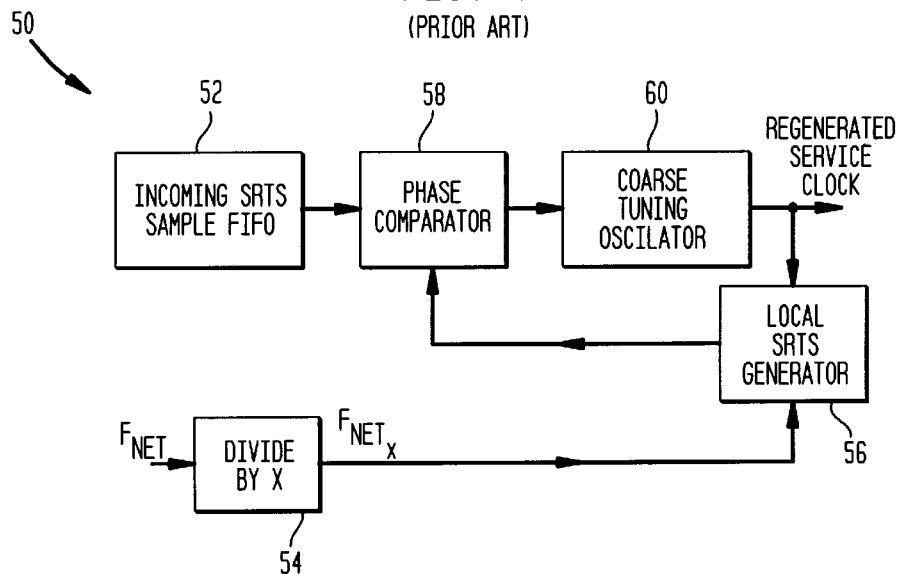
FIG. 4 shows a second conventional service clock regenerator.
Figure 6:
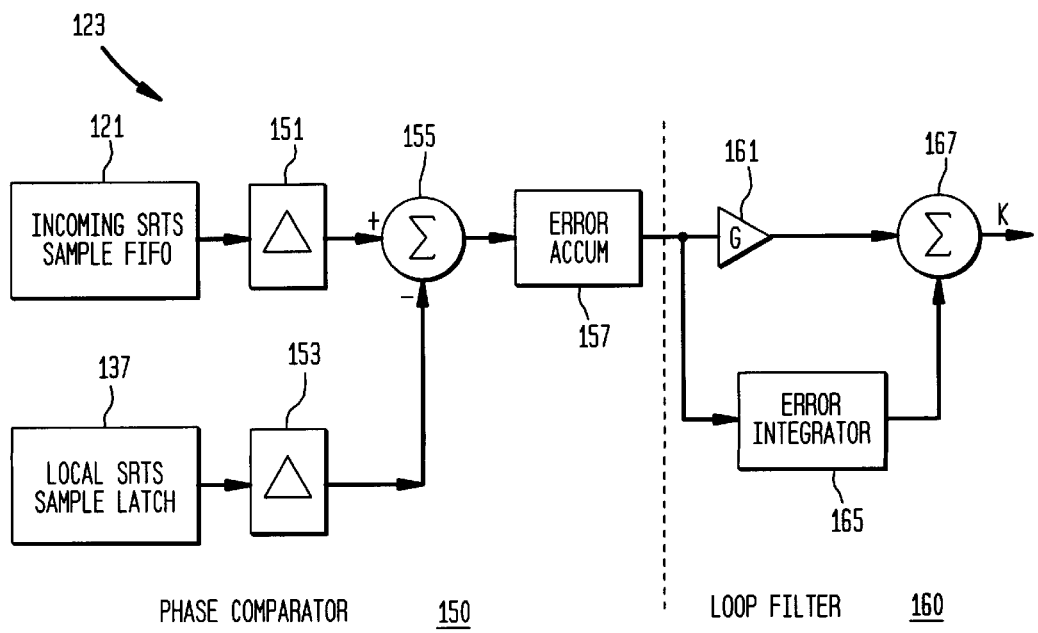
FIG. 6 shows the phase detector and loop filter according to an embodiment of the present invention in greater detail.

Referring now to FIG. 6, the phase comparator and loop filter 123 is described in greater detail. As shown, the phase comparator and loop filter 123 has a phase comparator section 150 and a loop filter section 160. In the phase comparator section 150, a subtractor 151 forms the slope of remote SRTS samples, e.g., by forming a difference between current and previous remote SRTS samples. Likewise, a subtractor 153 forms the slope of local SRTS samples, e.g., by forming a difference between current and previous local SRTS samples. A subtractor 155 forms the difference between the slope of the remote SRTS samples and the slope of the local SRTS samples. This difference of slopes is used to form an error voltage by adding the difference of slopes into the error accumulator 157.

In the loop filter 160, a (previously calculated) difference of slopes is amplified by a loop gain factor G using amplifier 161. The slope difference is also outputted to an error integrator 165, which can be implemented as an averager. The error integrator 165 is a calculator that adds the calculated phase error to its current value and then forms an output signal by dividing the sum thus formed by an averaging constant. The loop gain factor G and averaging constant are values selected depending on the frequency of the regenerated service clock, the frequency of the system clock and the desired transient response of the phase locked loop. An adder 167 adds the average phase error to the amplified phase error to produce a value of K. Illustratively K is an integer. K illustratively is bounded to lie between maximum and minimum permissible values.

As noted above, the phase comparator and loop filter 123 can be implemented on a processor 120. Below is an illustrative code segment that can be executed by the processor 120 to implement the phase comparator portion of the phase comparator and loop filter 123. In this code "Next_SRTS" is the most recently received remote SRTS sample, "Last_SRTS" is the previously received remote SRTS sample, 1srts_value is the local SRTS sample currently outputted from the local SRTS sample latch 137 and "LastLSRTS" is the previously generated local SRTS sample. "Ph_Error" is the phase error between the remote and local SRTS samples as represented by the difference of the slopes "SRTS_Delta" and "Pcount_Delta" of the remote SRTS samples and the local SRTS samples, respectively.

```
static int Ph_Error=0;
static char Last_SRTS LastLSRTS=0;
int SRTS_Delta Pcount_Delta;

/* generate the slope of the remote SRTS samples*/
SRTS_Delta=16 + Next_SRTS - Last_SRTS;
SRTS_Delta= fmod(SRTS_Delta 16);
Last_SRTS=Next_SRTS;

/* generate the slope of the local SRTS samples */
Pcount_Delta=16 + lsrts_value - LastLSRTS;
Pcount_Delta=fmod(Pcount_Delta, 16);
LastLSRTS=lsrts_value;

/* generate the phase error and store it for subsequent use*/
SRTS_Delta=Pcount_Delta;
if (SRTS_Delta>7)
```

```
        SRTS_Delta-=16;
    else if (SRTS_Delta<-8)
        SRTS_Delta+=16;
Ph_Error +=SRTS_Delta;
```

Using the above code, the phase error can be determined. The processor 120 can also run suitable code for implementing the loop filter portion 160 of the phase comparator and loop filter 123. Such code is within the ordinary skill in the art and therefore is omitted herein for sake of brevity. The loop filter 160 produces the adjustment value K from the phase errors produced by the phase detector portions 150 of the phase comparator and loop filter 123.

A software implementation of the loop filter 160 can also enforce limits on the frequency deviation of the recovered service clock. For example, the adjustment value K can be forced to lie between maximum and minimum thresholds through simple comparisons. This is advantageous in that other equipment receiving the recovered service clock might not be able to accommodate large deviations in the service clock frequency. Such a limitation on K may be triggered during acquisition and tracking of large phase transient events.

Preferably, the processor 120 initially loads a nominal value of K and the value of N into the digital frequency synthesizer 131. In an illustration, to recover a T1 service clock of 1.544 MHZ, L is fixed at 65,536, the network clock $F_{NETx}$ oscillates at 2.430 MHZ, the system clock Fc oscillates at 50 MHZ, N is set to 32 and K is set to 25,128.

The use of the slopes of the SRTS samples in the phase comparator section 150 causes the digital frequency synthesizer 131 to more accurately and quickly acquire and lock to the remote service clock. Note also that subtractions are performed by adding 16 to the difference between next and last SRTS samples and then truncating the difference to four bits (by the fmod function). The difference is thus always the number of increments in the count from the last (remote or local) SRTS sample to the next (remote or local) SRTS sample. This eliminates an inaccurate difference formed when the last SRTS sample and next SRTS sample are taken before and after a count roll-over, respectively.

In the loop filter 160, the use of the error integrator 165 tends to prevent abrupt adjustments to the frequency of the regenerated service clock. As such, a given phase error will take a certain number of cycles to be reflected at the output.

Figure 7:
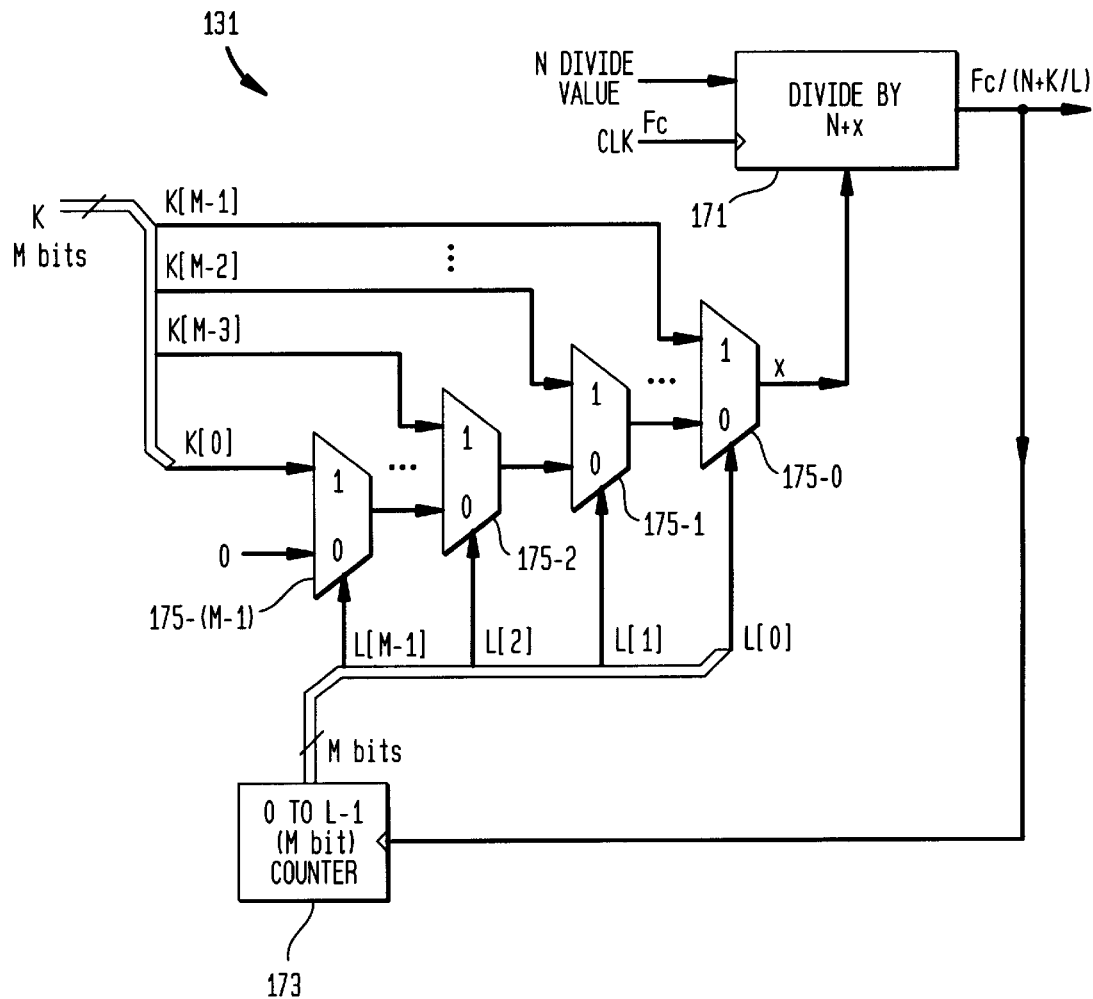
FIG. 7 shows the digital frequency synthesizer of the service clock regenerator in greater detail.
Figure 9:
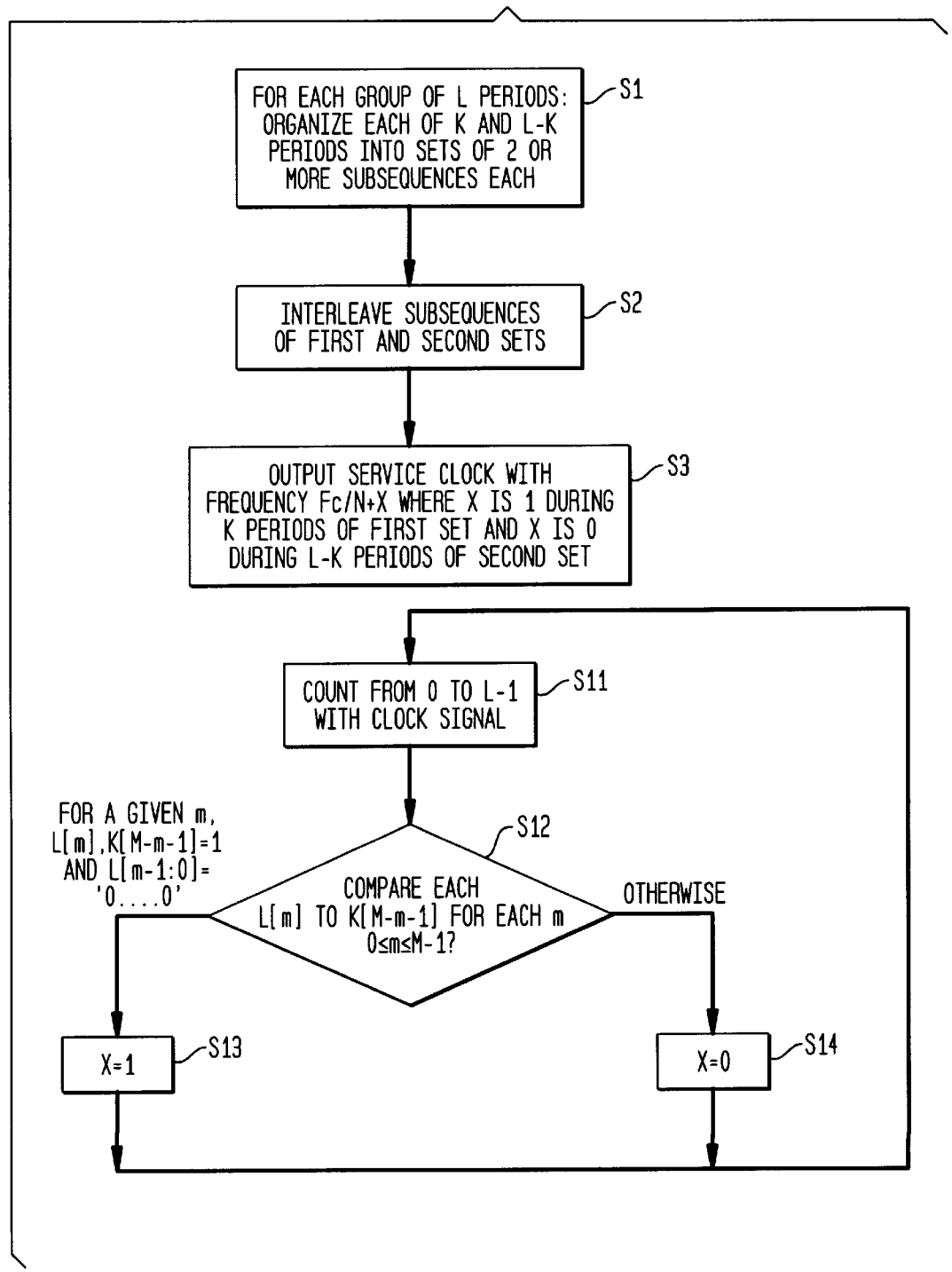
FIG. 9 shows a flowchart illustrating the operation of the frequency synthesizer.

Referring now to FIGS. 7 and 9, the operation of the digital frequency synthesizer 131 is described in greater detail. The digital frequency synthesizer 131 generates a signal having a frequency that nominally is Fc/(N+K/L) Hz on average over L periods by generating a signal with a frequency of Fc/(N+1) Hz for K periods and a frequency of Fc/N Hz for L−K periods each L period interval where L>K. Over each successive group of L periods, however, the periods during which the frequency of the service clock is Fc/N Hz and Fc/(N+1) Hz are distributed as evenly over the L periods as possible. That is, assuming K>1 and L−K>1, the K periods during which the frequency of the service clock is Fc/N Hz is divided into a set of two or more subsequences (step S1). Likewise, the L−K periods during which the frequency of the service clock is Fc/(N+1) Hz is divided into a second set of two or more subsequences (step S2). The subsequences of the first set are then interleaved with the subsequences of the second set (step S2) so that during an group of periods L for which K>1 and L−K >1, the frequency of the service clock will be Fc/(N+1) Hz for less than K consecutive periods and the frequency of the service clock will be Fc/N Hz for less than L−K consecutive periods.

The generation of such interleaved sequences can be achieved simply as follows. A frequency divider 171 is provided which receives a digital value representing N and the system clock of frequency Fc at its clock input. A binary bit signal X is also provided. The frequency divider 171 generates a clock signal having the frequency Fc/(N+X) where X can be 0 or 1 (step S3).

The clock signal thus generated is outputted from the digital frequency synthesizer. In addition, the clock signal is fed to the increment input of a counter 173. The counter 173 is an M bit counter that counts from 0 to L−1 and then rolls-over and begins to count from 0 again (step 11).

Each bit of the M bit counter 173 is fed as a select control input to a different multiplexer 175-0, 175-1, 175-2, ..., 175-(M−1). The multiplexers 175-0 to 175-(M−1) collectively form comparator circuitry for determining whether to output X=1 or X=0 to the frequency divider 171 (step 12). Each multiplexer compares a bit L[m] of the current count with a bit K[M−m−1] of the value K for a different value of m from 0 to M−1. That is, the most significant bit L[M−1] of the count is fed to the select control input of multiplexer 175-(M−1). The multiplexer 175-(M−1) receives the value 0 at the input 0 and the least significant bit of K, namely, K[0] at the input 1.

The output of multiplexer 175-(M−1) is connected to the input 0 of an adjacent multiplexer, in this case, multiplexer 175-2, receiving the second most significant bit of L, in this case L[2], as a select control input. The second least significant bit of K, namely, K[M−3] or K[1] is received at the input 1 of the multiplexer 175-2.

The output of multiplexer 175-2 is connected to the input 0 of an adjacent multiplexer, in this case, multiplexer 175-1, receiving the third most significant bit of L, in this case L[1], as a select control input. The third least significant bit of K, namely, K[M−2] or K[2] is received at the input 1 of the multiplexer 175-1.

The output of multiplexer 175-1 is connected to the input 0 of an adjacent multiplexer, in this case, multiplexer 175-0, receiving the least significant bit of L, in this case L[0], as a select control input. The most significant bit of K, namely, K[M−1] or K[3] is received at the input 1 of the multiplexer 175-0. The output of the multiplexer 175-0 is the value X fed to the frequency divider 171.

In operation, if a pair of compared bits L[m] and K[M−m−1] are both 1, and each lesser significant bit of the count L[m−1], L[m−2], ..., L[1], L[0] is 0, X=1 is outputted (step 13). Otherwise, X=0 is outputted (step 14). From inspection, it can be seen that the multiplexer 175-(M−1) can cause the value of X to be 1 only once each L periods, namely, when the count of L reaches its median value 10 ... 00, but only if the least significant bit K[0] of K is 1. The multiplexer 175-2 can cause the value of X to be 1 only twice during each L periods, namely, when the count of L reaches x100 (where "x" means "don't care") but only if the second least significant bit K[1] of K is 1. Likewise, the multiplexer 175-1 can cause the value of X to be 1 only four times during each L periods, namely, when the count of L reaches xx10 but only if the third least significant bit K[2] of K is 1. Lastly, the multiplexer 175-0 can cause the value of X to be 1 every second cycle during each L periods, namely, when the count of L reaches xxx1 but only if the most significant bit K[M−1] of K is 1.

Figure 8:
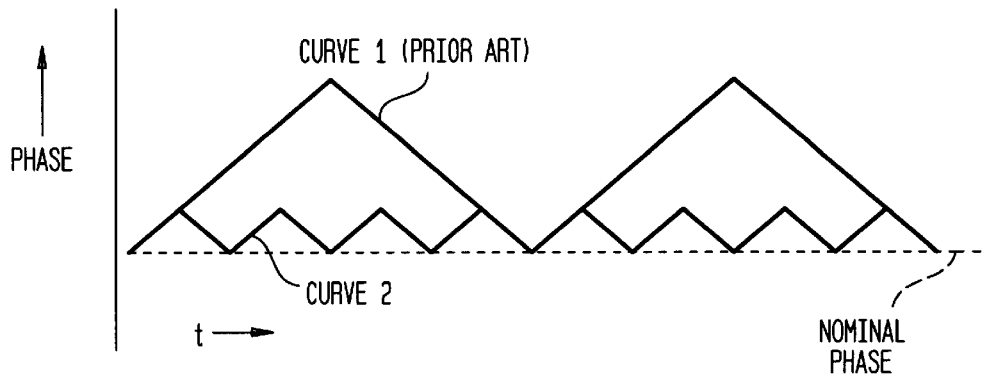
FIG. 8 shows a plot of phase difference versus time for a conventional digital frequency synthesizer and the digital frequency synthesizer of FIG. 7.

FIG. 8 illustrates the net effect of evenly distributing the K periods over the L periods. Assume that K=4 (binary 100) and L=8 (thus the maximum count=7 or binary 111). In FIG. 8, the curve "curve 1" represents a conventional technique where the frequency divider produces a signal having a frequency of Fc/(N+1) for K consecutive cycles and then a frequency of Fc/N for L−K consecutive cycles. The curve "curve 2" represents the inventive technique where the frequency divider 171 produces a signal having a frequency of Fc/(N+1) for fewer than K consecutive cycles, and a frequency of Fc/N for fewer than L−K consecutive periods. Specifically, the signal has the frequency Fc/(N+1) for no more than one consecutive period and the frequency of Fc/N for no more than one consecutive period, each L periods. As shown, the phase of curve 1 diverges much more from its nominal phase over the L periods than the phase of curve 2. Thus, the signal produced using the technique of the present invention minimizes the divergence from nominal phase of the generated clock signal.

Referring again to FIG. 5, the SRTS generator/service clock regenerator 130 can be used to generate SRTS samples for insertion into cells carrying transmitted data that are transmitted on the network from SAR 110. In such a case, the incoming SRTS sample FIFO 121 and phase comparator and loop filter 123 illustratively are not used. Two choices for providing the service clock are available. First, the digital frequency synthesizer 131 can be provided with values of N and K for generating a service clock with the appropriate frequency. Alternatively, if a higher accuracy is desired, an external service clock generator (not shown) may be connected to the external service clock input. In this case, an appropriate signal is fed to the select input of the multiplexer 133 to select the clock signal provided on the external service clock input. The service clock signal outputted from the multiplexer 133 is fed as a clock input to the set-able frequency divider 135. The frequency divider 135 is set to divide the service clock by an appropriate value to generate an SRTS sampling clock. Meanwhile, the network clock is fed to frequency divider 114 to produce a reduced frequency network clock. The reduced frequency network clock is provided to the increment input of the 4-bit roll-over counter 139. The current count of the 4-bit roll-over counter is outputted to a data input of the latch 137. The latch 137 latches the current count of the 4-bit roll-over counter in response to each pulse of the SRTS sampling clock outputted from the set-able frequency divider 135. When this occurs, an indication is provided to the SAR 110 indicating that an SRTS sample of the service clock is available for insertion into outgoing cells. The SAR 110 receives the SRTS sample and inserts the bits thereof into headers of cells transmitted to the network.

The above discussion is intended to be merely illustrative of the invention. Those having ordinary skill in the art may devise numerous alternative embodiments without departing from the spirit and scope of the following claims.

The claimed invention is:

1. A method of generating a clock signal with a nominal frequency of Fc/(N+K/L) Hz over each successive interval of L periods, where N, K and L are integers, and L>K, and wherein Fc is a system clock, comprising the steps of:

(a) organizing each set of L periods, including a first set of K periods and a second set of L−K periods, by interleaving two or more non-null subsequences of periods of the first set with two or more non-null subsequences of periods of the second set, (b) during each period of one of the subsequences of the first set, outputting as the clock, a first signal with a frequency of Fc/(N+1) Hz, (c) during each period of one of the subsequences of the second set, outputting as the clock, a second signal with a frequency of Fc/N Hz, (d) counting the periods of the clock such that periods of the first signal with the frequency Fc/(N+1) Hz are counted only during periods of the subsequences of the first set and periods of the second signal with the frequency of Fc/N Hz are counted only during periods of the subsequences of the second set, and (e) determining to switch between outputting the first signal as the clock and outputting the second signal as the clock based on the count obtained in step (d).

2. A method of generating a clock signal with a nominal frequency of Fc/(N+K/L) Hz over each successive interval of L periods, where N, K and L are integers, and L>K, and wherein Fc is a system clock, comprising the steps of:

(a) organizing each set of L periods, including a first set of K periods and a second set of L-K periods, by interleaving two or more non-null subsequences of periods of the first set with two or more non-null subsequences of periods of the second set, (b) during each period of one of the subsequences of the first set, outputting the clock with a frequency of Fc/(N+1) Hz, (c) during each period of one of the subsequences of the second set, outputting the clock with a frequency of Fc/N Hz, counting from 0 to L−1 and generating an M bit binary representation of the count, comparing each $m^{th}$ bit of the count L with an (M−m−1)$^{th}$ bit K(M−m−1) of an M bit binary representation of K(0:M−1), where $0 \leq m \leq M-1$ if any compared pair of bits L(m) and K(M−m−1) are both 1 and each lesser significant bit L(m−1), L(m−2), . . . , L(1), L(0) is 0, performing step (b), and otherwise, performing step (c).

3. A digital frequency synthesizer for generating a clock signal with a nominal frequency of Fc/(N+K/L) Hz over each successive interval of L periods, where N, K and L are integers, and L>K, and wherein Fc is a system clock, comprising:

comparator circuitry for organizing each set of L periods, including a first set of K periods and a second set of L−K periods, by interleaving two or more non-null subsequences of periods of the first set with two or more non-null subsequences of periods of the second set, a frequency divider receiving a signal with period Fc and an indication from the comparator circuitry for outputting as the clock, a fir signal having a frequency of Fc/(N+1) Hz, during each period of one of the subsequences of the first set, and outputting as the clock, a second signal having the frequency of Fc/N Hz, during each period of one of the subsequences of the second set, a counter for counting the periods of the clock such that periods of the first signal with the frequency Fc/(N+1) Hz are counted only during periods of the subsequences of the first set and periods of the second signal with the frequency of Fc/N Hz are counted only during periods of the subsequences of the second set, the comparator circuitry receiving the count of the counter and generating the indication for switching between outputting the first signal as the clock and outputting the second signal as the clock based on the count obtained from the counter.

4. A digital frequency synthesizer for generating a clock signal with a nominal frequency of Fc/(N+K/L) Hz over each successive interval of L periods, where N, K and L are integers, and L>K, and wherein Fc is a system clock, comprising:

comparator circuitry for organizing each set of L periods, including a first set of K periods and a second set of L−K periods, by interleaving two or more non-null subsequences of periods of the first set with two or more non-null subsequences of periods of the second set, and a frequency divider receiving a clock signal with period Fc and an indication from the comparator circuitry for outputting a clock signal having a frequency of Fc/(N+1) Hz, during each period of one of the subsequences of the first set, and outputting a clock signal having the frequency of Fc/N Hz, during each period of one of the subsequences of the second set, and a counter for counting from 0 to L-1 and generating an M bit binary representation of the count L(0:M−1), said comparator circuitry further comprising M multiplexers, each $m^{th}$ multiplexer comparing each $m^{th}$ bit of the count L(m) with an (M−m−1)$^{th}$ bit K(M−m−1) of an M bit binary representation of K(0:M−1), where $0 \leq m \leq M-1$, said M multiplexers having their inputs and outputs connected in tandem so that if any compared pair of bits L(m) and K(M−m−1) are both 1 and each lesser significant bit L(m−1), L(m−2), . . . , L(1), L(0) is 0, said comparator circuitry outputs an indication for outputting said clock signal with a frequency of Fc/(N+1) and otherwise outputs an indication for outputting said clock signal with a frequency of Fc/N.

\* \* \* \* \*